(12) United States Patent
Hobelsberger

(10) Patent No.: US 9,229,043 B2
(45) Date of Patent: Jan. 5, 2016

(54) PARTIAL DISCHARGE SENSOR FOR A HIGH VOLTAGE INSULATION MONITORING DEVICE

(71) Applicant: ALSTOM Technology Ltd, Baden (CH)

(72) Inventor: Maximilian Hobelsberger, Wuerenlingen (CH)

(73) Assignee: ALSTOM TECHNOLOGY LTD (CH)

( * ) Notice: Subject to any disclaimer, the term of this patent is extended or adjusted under 35 U.S.C. 154(b) by 244 days.

(21) Appl. No.: 13/868,194

(22) Filed: Apr. 23, 2013

(65) Prior Publication Data

US 2013/0234726 A1    Sep. 12, 2013

Related U.S. Application Data

(63) Continuation of application No. PCT/EP2011/068400, filed on Oct. 21, 2011.

(30) Foreign Application Priority Data

Nov. 4, 2010    (EP) .................................... 10190063

(51) Int. Cl.
    *G01R 31/14*    (2006.01)
    *G01R 15/16*    (2006.01)
    *G01R 31/12*    (2006.01)
    *G01R 35/00*    (2006.01)

(52) U.S. Cl.
    CPC ................ *G01R 31/14* (2013.01); *G01R 15/16* (2013.01); *G01R 31/1227* (2013.01); *G01R 35/005* (2013.01)

(58) Field of Classification Search
    CPC ............. G01R 35/005; G01R 31/1272; G01R 31/1227; G01R 15/16
    See application file for complete search history.

(56) References Cited

U.S. PATENT DOCUMENTS 5,323,117 A *  6/1994  Endoh et al. .................. 324/551
5,386,193 A    1/1995  Maeda et al.

(Continued)

FOREIGN PATENT DOCUMENTS

CN    101063637 A    10/2007
DE       3912654 A1    9/1988

(Continued)

OTHER PUBLICATIONS

European Search Report for No. 10190063.7, Mar. 5, 2011.

(Continued)

*Primary Examiner* — Tung X Nguyen
*Assistant Examiner* — Adam Clarke
(74) *Attorney, Agent, or Firm* — Cantor Colburn LLP

(57) ABSTRACT

The present invention relates to a partial discharge sensor for a high-voltage insulation monitoring device comprising a housing and located in the housing a measurement circuit for measurement of partial discharges in a high voltage system to be tested and a coupling capacitor having one electrode connected to the measurement circuit and the other electrode to a first high voltage conductor to be connected to a high voltage line of the system to be tested, wherein it further comprises a calibration circuit located in the housing and comprising a calibration capacitor having one electrode connected to the calibration circuit and the other electrode connected to said first or a second high voltage conductor to be connected to a high voltage line.

13 Claims, 4 Drawing Sheets

(56) References Cited

U.S. PATENT DOCUMENTS

| | | | | |
|---|---|---|---|---|
| 6,255,808 B1* | 7/2001 | Hucker | ............ | G01R 31/1254 250/206.1 |
| 8,098,072 B2* | 1/2012 | Twerdochlib | ................. | 324/536 |
| 2002/0125877 A1* | 9/2002 | Cooke | ........................ | 324/127 |
| 2003/0038016 A1* | 2/2003 | Hilal | ........................... | 200/1 R |
| 2009/0284250 A1 | 11/2009 | Rittmann | | |
| 2011/0204899 A1* | 8/2011 | Klapper et al. | ............... | 324/532 |
| 2012/0319703 A1* | 12/2012 | Serra | ................. | G01R 31/1227 324/649 |

FOREIGN PATENT DOCUMENTS

| | | |
|---|---|---|
| EA | 001639 B1 | 6/2001 |
| EP | 0628829 A1 | 12/1994 |
| EP | 2071342 A1 | 6/2009 |
| JP | H07-43411 A | 2/1995 |
| JP | H08-262097 A | 10/1996 |
| SU | 1190309 A1 | 11/1985 |
| WO | 9963352 | 12/1999 |

OTHER PUBLICATIONS

International Search Report and the Written Report of the International Searcing Authority, PCT/EP2011/068400; date of mailing Nov. 23, 2011.

Decision of Grant issued from Russian Patent Office dated Jun. 5, 2015 for RU Application No. 2013125567.

* cited by examiner

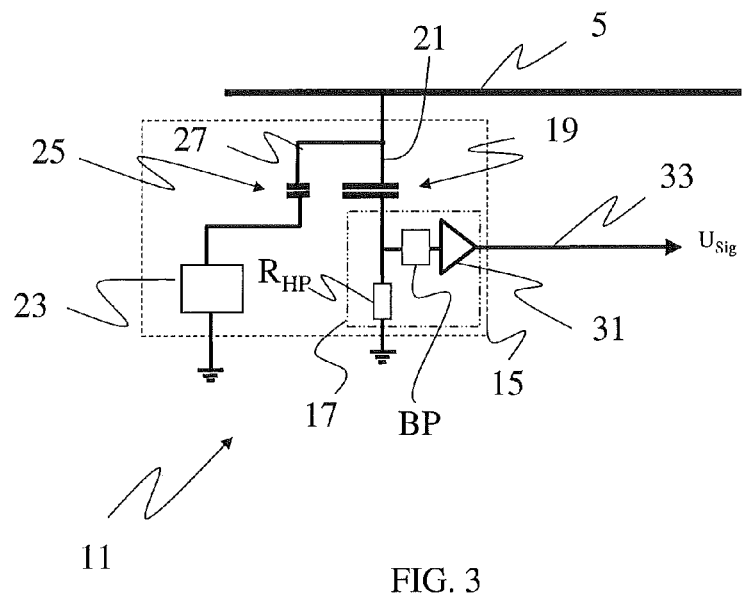
FIG. 3
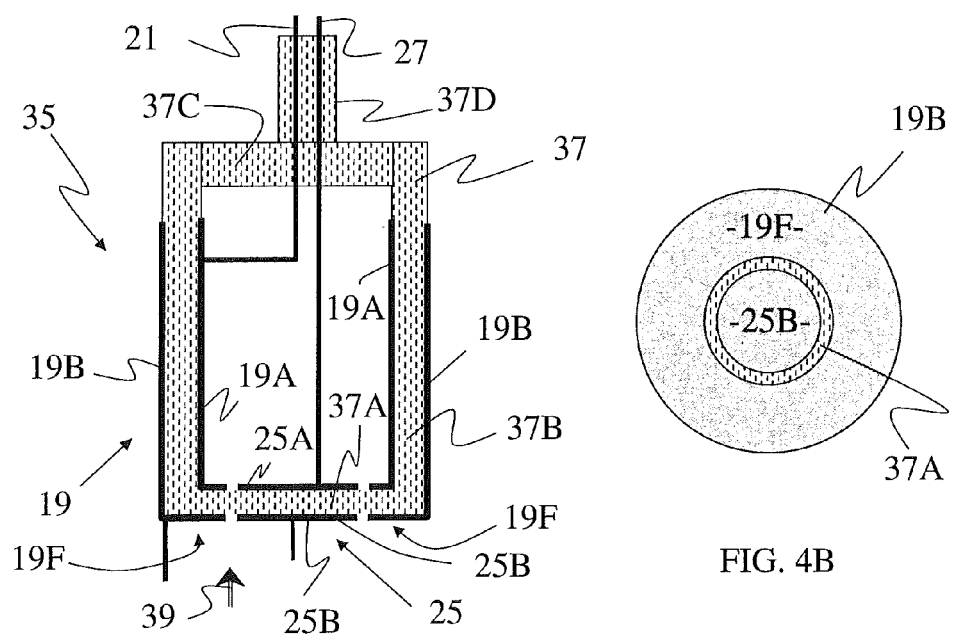
FIG. 4A
FIG. 4B

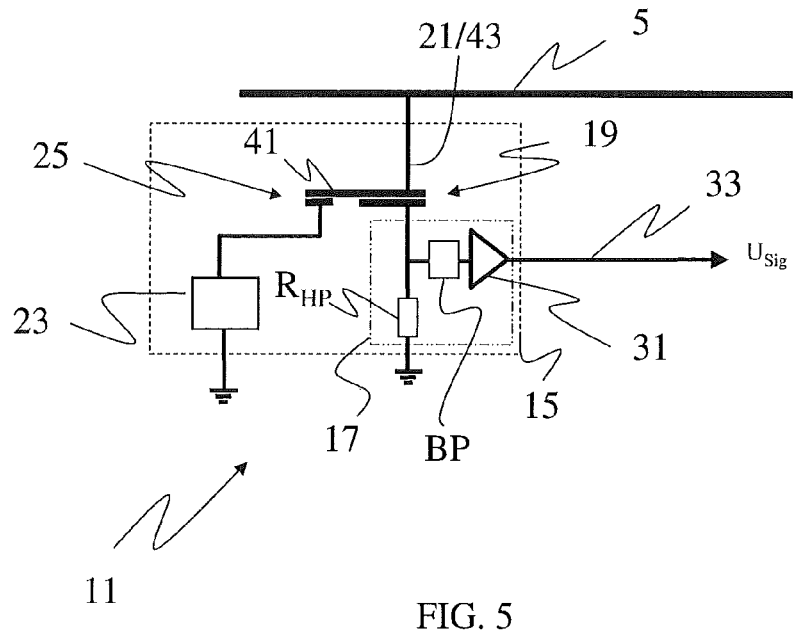
FIG. 5
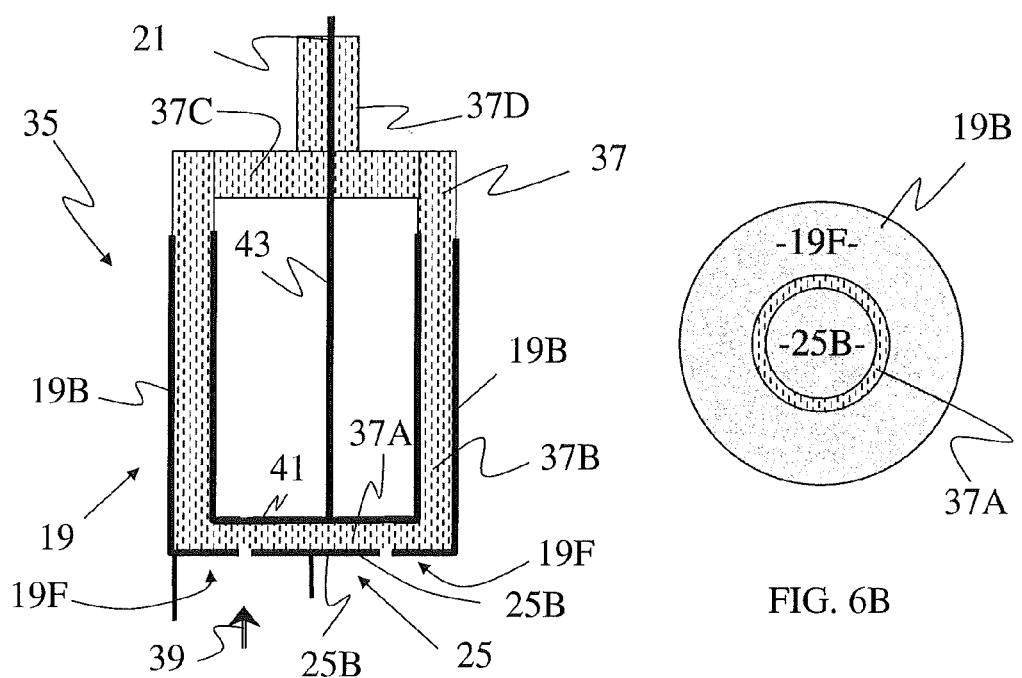
FIG. 6A
FIG. 6B

PARTIAL DISCHARGE SENSOR FOR A HIGH VOLTAGE INSULATION MONITORING DEVICE

The present invention relates to a partial discharge sensor for a high-voltage insulation monitoring device, in particular but not only for measuring partial discharges in the stator windings of large electrical generators of a power plant.

BACKGROUND OF THE INVENTION

Partial discharges (PD) are locally occurring electric discharges that partially bridge the insulation between conductors, in particular used in high voltage electrical generation.

They are the result of insulation defects when the electrical field is locally beyond the breakdown strength. Such partial discharges may even lead to further degradation of the insulation between the conductor and even breakdown.

Therefore, the monitoring of partial discharges in high voltage systems is needed to prevent dysfunctioning and damages in a power generation chain. In addition, it is a helpful tool in order to plan shut downs and maintenance of the equipment or replacements.

In industry, measurement of partial discharges is well described in standard EN/IEC 60270 entitled "High voltage Test Techniques—Partial Discharge measurements" (2000). It describes design and calibration of electrical circuits used to determine partial discharges.

It is important to notice that before the measurement of partial discharges, the measurement system needs to be calibrated in order to reach the needed accuracy. Calibration is usually made by injecting a pulse into the system and detecting the response of the measurement device.

The classical calibration devices can only be used off-line, at stand still of the generator because the known devices are not high voltage resistant.

However, the operation conditions on-line and off-line are quite different from each other which impacts the calibration precision. In fact, during operation the main switch connecting the generator to the grid is closed and thus the electric line is much longer. This causes a larger line capacitance and changes the transmission characteristics of the pulses.

Thus, it is desirable to be able to calibrate the high voltage insulation monitoring device during normal operation of the generator.

EP 2 071 342 discloses a portable calibration device that might be used during normal operation as the power supply is achieved via a battery and remote controlling is done via an optical interface.

However, it's an add-on device that changes the high voltage geometry of the power excitation chain and due to the battery supply, the injected pulses are quite small and the time of operation limited.

It is an object of the present invention to overcome at least partially the above cited drawbacks, in particular to propose a device that allows on-line calibration, even during high voltage insulation monitoring.

SUMMARY OF THE INVENTION

An aspect of the invention includes providing a sensor including a monitoring device that can be calibrated also with the generator connected to the grid.

This and further aspects are attained by providing a partial discharge sensor in accordance with the accompanying claims.

The sensor might have the one or more of following optional features alone or in combination:

a coupling capacitor and a calibration capacitor realized as one dual capacitor, the coupling capacitor and the calibration capacitor realized as two individual capacitors, a measurement circuit comprises a signal transmission line and an electrical power for operation of the measurement circuit and the calibration circuit is supplied through the signal transmission line, a converter supply circuit can be provided connectable to the measurement device and coupled to the low voltage electrode of the measurement capacitor, for supplying the calibration circuit with the necessary supply voltage, the calibration circuit comprises a pulse generator synchronization line connected between the coupling capacitance and the calibration circuit, the calibration circuit includes two branches connected in parallel, a first branch connected on the one hand to earth and on the other hand to a switching unit and a second branch comprising in parallel a capacitor and a signal generator, one end of the second branch being connected to earth and the other end being also connected to the switching unit, the switching unit being connected to the calibration capacitor, the switching unit has two positions, a first position connecting the calibration capacitance to the first branch and a second position, connecting the calibration capacitance to the second branch, a serial communication channel connectable to a measurement device for adjusting the height and sequence of the pulses and/or to control the switching unit 57.

BRIEF DESCRIPTION OF THE DRAWINGS

FIG. 3 is a schematic representation of the partial discharge sensor according to a second embodiment, FIGS. 4A and 4B are a schematic representation of a dual capacitor of the partial discharge sensor according a first embodiment, FIG. 5 is a schematic representation of the partial discharge sensor according to a third embodiment, FIGS. 6A and 6B are a schematic representation of a dual capacitor of the partial discharge sensor according a second embodiment.

DETAILED DESCRIPTION OF THE INVENTION

In all figures identical elements have the same reference number.

Figure 1:
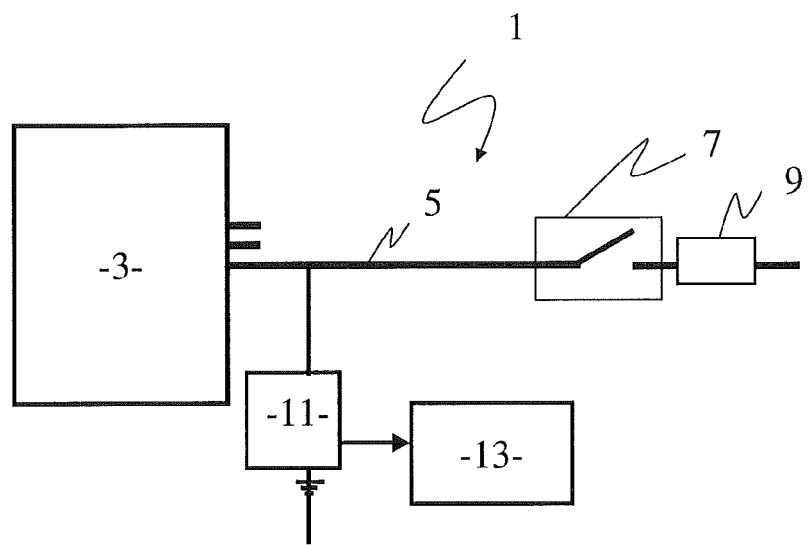
FIG. 1 is a schematic representation of a high voltage power generation chain equipped with a partial discharge sensor and a partial discharge analyzer.

FIG. 1 is a schematic representation of a high voltage power generation chain 1 comprising a generator 3 having several phases but only one output phase and the related high voltage bus duct 5 are represented.

The generator 3 may be driven by not represented turbines or engines fed by any available energy source or combination of energy sources (coal, fuel, gas, nuclear, steam, water, etc). The generator may be a synchronous generator and generates typically an alternative voltage at 50-60 Hz of more than 5 kV.

The bus duct 5 is connected to a switching unit 7 that allows to decouple the generator 3 from the following elements for example a step up transformer 9 and finally the grid.

A partial discharge sensor 11 is connected to the bus duct 5 and the output of the sensor 11 is connected to a partial discharge analyzing equipment 13. Both, the partial discharge sensor 11 and the partial discharge analyzing equipment 13 are part of a high voltage insulation monitoring device. It's purpose is to monitor partial discharges in particular in the stator winding of the generator. Such monitoring allows to prevent dysfunctioning due to insulation defects that may occur during operation.

In normal operation of the generator 3 and when the generator 3 is connected to the grid, the bus duct 5 is a high voltage line.

Figure 2:
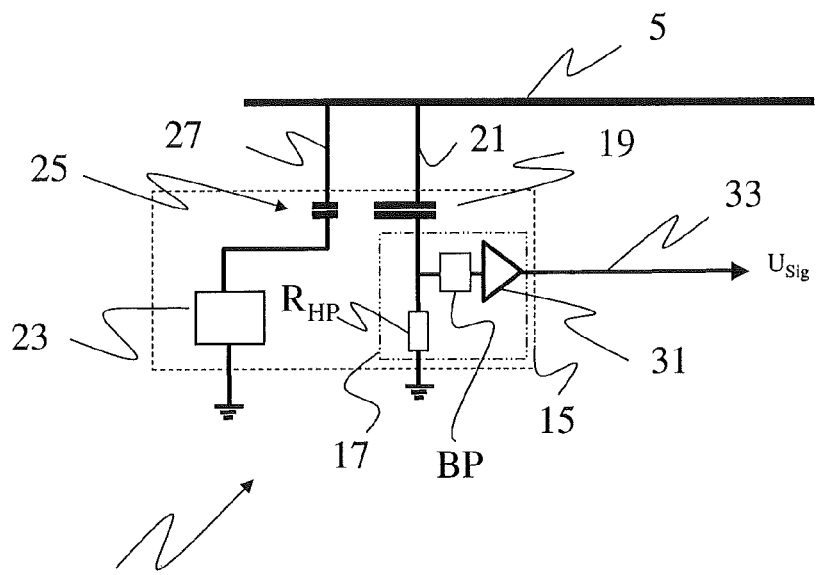
FIG. 2 is a schematic representation of the partial discharge sensor according to a first embodiment.

FIG. 2 shows the partial discharge sensor 11 more in detail.

In particular, the partial discharge sensor comprises a housing 15 that locates on the one hand a measurement circuit 17 for measurement of partial discharges in the high voltage system to be tested, that is the generator 3 and a coupling capacitor 19 having one electrode connected to the measurement circuit 17 and the other electrode to a first high voltage conductor 21 to be connected to a high voltage line, the bus duct 5, of the system to be tested.

The sensor 11 further comprises in the housing 15 a calibration circuit 23 and a calibration capacitor 25 having one electrode connected to the calibration circuit 23 and the other electrode connected to a second high voltage conductor 27 connected to the high voltage line, the bus duct 5.

In order to give some guidance for realization of the circuit, the calibration capacitor 25 is about 20 pF whereas the coupling capacitor 19 has a capacitance of 100 pF.

More in detail, the measurement circuit 17 comprises a high pass resistance RHP, for example of 100 kΩ, connected on the one side to the coupling capacitor 19 and on the other side to earth, and a bandpass BP, having a pass-band of e.g. 20 kHz to 10 MHz, and connected on the one side to the coupling capacitor 19 and on the other side to an amplifier 31. The output of the amplifier 31 is a voltage signal that is sent via a signal line 33 to the partial discharge analyzing equipment 13. The high pass frequency is for example f0=16 kHz.

The calibration circuit 23 is configured to send out calibration pluses of defined shape, corresponding to a predefined charge and coupled to the high voltage system via the calibration capacitance 25.

As the electronics circuits 23 and 17 are not at high voltage potential, a power supply via the signal line 33 is realized.

Thus, the present solution allows to calibrate a high-voltage insulation monitoring device during operation. As the calibration circuit 23 as well as the related coupling capacitor 25 are integrated into the same housing 15 of the partial discharge sensor 11 which is foreseen in the installation per se, there is no need to review the high voltage geometry of the whole power excitation chain. In addition, as the power supply for the calibration circuit 23 is achieved via the signal transmission line 33, there are quite less restrictions concerning the injected calibration charges into the high voltage system.

FIG. 3 shows a second embodiment of a partial discharge sensor 11 which differs from the embodiment of FIG. 2 only by the fact that the second high voltage conductor 27 is connected within the housing 15 to the first high voltage conductor 21. Therefore, there is only one high voltage conductor 21 to be connected to the high voltage line, the bus duct 5, meaning that the installation of the partial discharge sensor 11 is the same as those already used.

As could be seen on FIGS. 2 and 3, the coupling capacitor 19 and the calibration capacitor 25 are two distinct capacitors.

In order to gain in construction space, it is foreseen to realize both capacitors 19 and 25 as one constructive unit, as a dual capacitor unit 35 as shown for example in FIGS. 4A and 4B which are a schematic representation of a dual capacitor of the partial discharge sensor according to a first embodiment.

The dual capacitor 35 comprises a hollow cylindrical shaped isolator 37, in particular with a bottom 37A, cylindrical side walls 37B, a top wall 37C that has a connection chimney 37D. The isolator may have a wall thickness of 5 mm, a height of 5 cm and an outer diameter of 5 cm and can be made of a plastic composite.

Also shown are the high voltage conductors 21 and 27 which are traversing the chimney 37D and that are connected respectively to the high voltage part electrodes 19A of coupling capacitor 19 and 25A of calibration capacitor 25.

These electrodes 19A and 25A are located on the inner side of the hollow insulator 37. On the opposite side of the walls 37A and 37B, on the outer side of the isolator 37 are arranged the electrode 19B of coupling capacitor 19 connected to the measurement circuit 17 and the electrode 25B of calibration capacitor 25 connected to the calibration circuit 23.

More in detail, the major part of the electrodes 19A and 19B are located on the side wall 37 B of the insulator and a smaller foot part 19F is located on the outer peripheral part of the bottom wall 37A.

This is also clearly represented on FIG. 4B which is a view on the bottom end of the dual capacitor 35 seen along arrow 39 on FIG. 4A.

The calibration capacitor 25 is smaller in capacitance. In the present case, both electrodes 25A and 25B are shaped as a disk and located at a bottom wall 37 A of the cylindrically shaped isolator 37.

The capacitance of the measurement capacitor 19 is typically 100 pF and that of the calibration capacitor of 20 pF.

It is easy to understand that this construction of a dual capacitor does not need more, or at least not much more space than the classically used coupling capacitors of partial discharge sensors.

The configuration of FIGS. 4A and 4B is used for example for the embodiment of FIG. 2. For the embodiment of FIG. 3, the high voltage conductors 21 and 27 might be connected together within the hollow volume of the isolator 37 in order that only one high voltage conductor traverses the chimney 37D to be connected to the high voltage line, the bus duct 5.

In FIG. 5 is shown a schematic representation of the partial discharge sensor 11 according to a third embodiment.

This embodiment differs from that shown in FIG. 3 by the fact that on the high voltage side, the coupling capacitor 19 and the calibration capacitor 25 have a common electrode 41.

This embodiment can be realized in slightly modifying the dual capacitor 35 shown in FIG. 4A.

Such a modified dual capacitor 35 is shown in FIGS. 6A and 6B which are a schematic representation of the dual capacitor of the partial discharge sensor according a second embodiment.

The dual capacitor 35 in FIG. 6A only differs from that shown in FIG. 4A by the fact that there is only one common high voltage conductor 43, replacing conductors 21 and 27, and that the high voltage electrodes 19A and 25A on the inner side of the isolator 37 are joined to form a common high voltage electrode 41.

Even with a common electrode 41, the surfaces of the electrodes 19B and 25B are chosen in such a way that the capacitance of the measurement capacitor 19 is typically 100 pF and that of the calibration capacitor of 20 pF.

This construction is even more easy to achieve and allows quite very performant on line calibrations and measurements of partial discharges.

Figure 7:
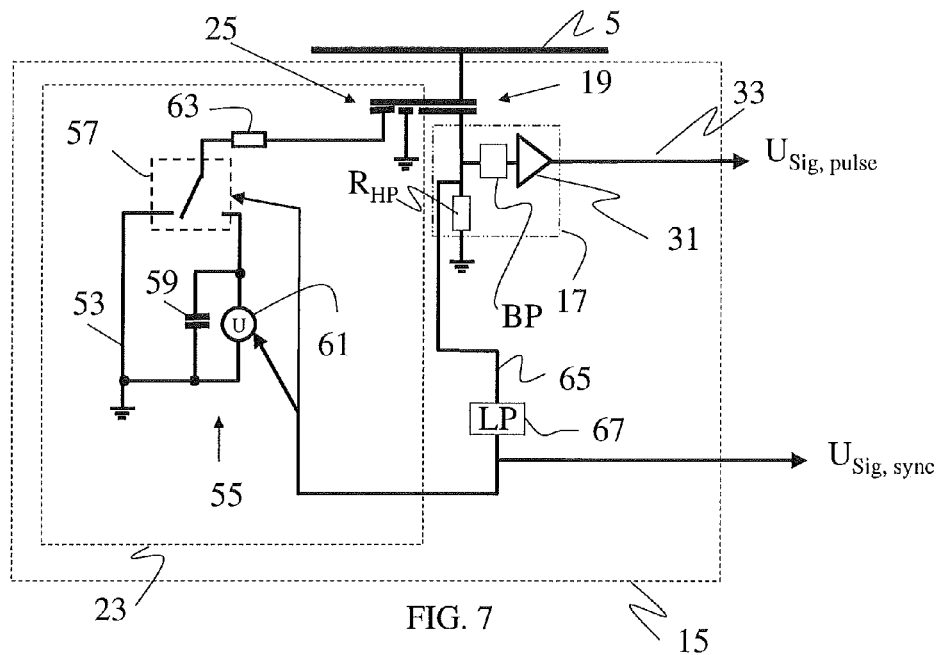
FIG. 7 is a schematic representation of the partial discharge sensor according to a forth embodiment.

In FIG. 7 is illustrated more in detail an example of a calibration circuit 23 with its calibration capacitor 25.

The circuit 23 comprises a pulse generator with two branches 53, 55 connected in parallel, a first branch 53 connected on the one hand to earth and on the other hand to a switching unit 57 and a second branch 55 comprising in parallel a capacitor 59, having a capacitance of about 1 nF, and a signal generator 61, one end of the second branch 55 being connected to earth and the other end being also connected to the switching unit 57. The switching unit 57 is connected via an ohmic resistance 63 of about 100Ω to the electrode 25B of the calibration capacitor 25. The signal generator 61 can generate step signals or ramp signals from 1 to 200V.

A synchronization line 65 is connected on the one side to the measurement circuit 17 to the electrode 19B of the coupling capacitance 19 and on the other side after a low pass filter 67 (for the frequency of the grid, such as for example 50 or 60 Hz) to a synchronization external output, the signal generator 61 and the switching unit 57.

This synchronization signal allows coordination of the pulse injections of the calibration circuit 23, for example in a way that the switching unit 57 switches between 10-100 times per period of the alternative voltage produced by the generator 3.

The switching unit 57 has two positions, a first position connecting the calibration capacitance 25 to the first branch 53 and a second position, connecting the calibration capacitance 25 to the second branch 55.

The circuit works in such a way that the capacitor 59 is charged to a certain voltage, for example 100V, through the voltage generator 61. Through the switching unit 57, when in the second position, a pulse is generated and injected into the high voltage system. The injected charge can be calculated from the capacitance of the capacitor 59 and the applied voltage. For example for 100V applied to the capacitor 59 having a capacitance of 10 pF, it results an injected pulse charge of 1 nC.

In FIG. 7, the power supply is achieved via the signal transmission line.

Figure 8:
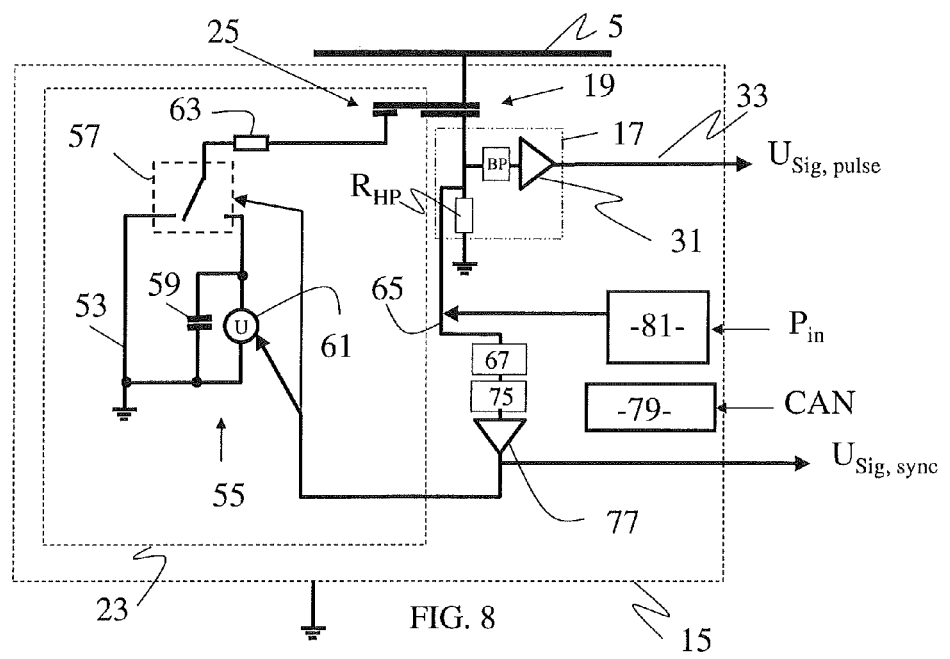
FIG. 8 is a schematic representation of the partial discharge sensor according to a fifth embodiment.

Turning now to FIG. 8, there is shown a further fifth embodiment with autonomous power supply.

The embodiment of FIG. 8 differs from that in FIG. 7, by the fact that amplifier 31 has a differential output and that the signal transmission line comprises a twisted cable pair, which is firstly cheaper than known coaxial cables when cables with multiple pairs are needed as in this embodiment, and which is secondly better balanced in its electrical characteristics. Furthermore, after low pass filter 67 in the synchronization line 65 is disposed an integrator 75 and an amplifier 77 with differential output allowing also to use a second twisted cable pair for the synchronization output of the partial discharge sensor 11.

Furthermore, within the sensor 11 is foreseen a microprocessor that can be controlled via a serial communication channel, for example a CAN-BUS for adjusting the height and sequence of the pulses. It might be also used to control the switching unit 57. For the sake of clearness of the scheme, the control lines are not represented.

In addition the partial discharge sensor 11 comprises a converter supply circuit 81 coupled to the low voltage electrode 19B of the measurement capacitor 19, for supplying the calibration circuit with the necessary supply voltage.

The converter supply circuit has for example two branches with respectively a diode and a capacitor for transforming the alternative voltage into a DC voltage and a DC/DC converter in order to get an operational voltage of +/−5V. For the sake of clearness of the scheme, the power supply lines are not represented.

Thank to the present invention, calibrations of PD sensor can be made on-line and the proposed equipment fits in the mounting space of already existing PD-sensors. Therefore, the installation of the PD sensor according to the invention does not need to redesign the high voltage geometry around the high voltage power generation chain.

In addition, maintenance is reduced as the presented sensor does not need a battery supply.

The invention claimed is:

1. A partial discharge sensor for a high-voltage insulation monitoring device; comprising a housing and located in the housing a measurement circuit for measurement of partial discharges in a high voltage system to be tested and a coupling capacitor having one electrode connected to the measurement circuit and the other electrode to a first high voltage conductor to be connected to a high voltage line of the system to be tested,
wherein it further comprises a calibration circuit comprising a calibration capacitor having one electrode connected to the calibration circuit and the other electrode connected to said first or a second high voltage conductor to be connected to a high voltage line,
wherein the coupling capacitor and the calibration capacitor are realized as one dual capacitor,
wherein an electrode of the dual capacitor connected to the high voltage conductor is a common electrode to both, the coupling capacitor and the calibration capacitor, and
wherein the measurement circuit comprises a signal transmission line and the electrical power for operation of the measurement circuit and the calibration circuit is supplied through the signal transmission line.

2. The partial discharge sensor according to claim 1, wherein the calibration circuit is located in the housing.

3. The partial discharge sensor according to claim 1, wherein the dual capacitor comprises a hollow cylindrical shaped isolator having at least one high voltage electrode located on an inner wall of the isolator and two electrodes respectively connected to the measurement circuit and the calibration circuit and located on an outer wall of the isolator.

4. The partial discharge sensor according to claim 3, wherein the electrode connected to the calibration circuit is shaped as a disk and located at a bottom of said cylindrically shaped isolator.

5. The partial discharge sensor according to claim 3, where the electrode connected to the measurement circuit is mainly shaped as a cylinder and mainly located on a side wall of said cylindrically shaped isolator.

6. The partial discharge sensor according to claim 1, wherein the coupling capacitor and the calibration capacitor are realized as two individual capacitors.

7. The partial discharge sensor according to claim 1, further comprising a converter supply circuit coupled to the low voltage electrode of the coupling capacitor, for supplying the calibration circuit with a necessary supply voltage.

8. The partial discharge sensor according to claim 1, wherein the measurement circuit comprises an amplifier with differential output and where the signal transmission line is realized as twisted cable pair.

9. The partial discharge sensor according to claim 1, wherein the calibration circuit comprises a pulse generator synchronization line that is connected between the coupling capacitance and the calibration circuit.

10. The partial discharge sensor according to claim 9, wherein the calibration circuit includes two branches connected in parallel, a first branch connected on the one hand to earth and on the other hand to a switching unit and a second branch comprising in parallel a capacitor and a signal generator, one end of the second branch being connected to earth and the other end being also connected to the switching unit, the switching unit being connected to the calibration capacitor.

11. The partial discharge sensor according to claim 10, wherein the switching unit has two positions, a first position connecting the calibration capacitance to the first branch and a second position, connecting the calibration capacitance to the second branch.

12. The partial discharge sensor according to claim 10, further comprising a serial communication channel for adjusting a height and a sequence of calibration pulses and/or to control the switching.

13. The partial discharge sensor according to claim 1, further comprising a serial communication channel for adjusting a height and a sequence of calibration pulses and/or to control a switching unit.

* * * * *